United States Patent [19]

Umeki

[11] Patent Number: 4,883,990

[45] Date of Patent: Nov. 28, 1989

[54] ECL-TTL LEVEL CONVERTER

[75] Inventor: Yoshitaka Umeki, Tokyo, Japan

[73] Assignee: NEC Corporation, Tokyo, Japan

[21] Appl. No.: 264,555

[22] Filed: Oct. 31, 1988

[30] Foreign Application Priority Data

Oct. 30, 1987 [JP] Japan .................................. 62-276604

[51] Int. Cl.⁴ ................. H03K 19/092; H03K 19/086; H03K 17/10; H03K 17/14
[52] U.S. Cl. .................................... 307/473; 307/475; 307/455; 307/544; 307/264
[58] Field of Search ............... 307/454, 455, 456, 459, 307/467, 475, 355, 356, 358, 264, 260, 473, 551, 544

[56] References Cited

U.S. PATENT DOCUMENTS

| 4,339,676 | 7/1982 | Ramsey | 307/456 X |
| 4,623,803 | 11/1986 | Thompson et al. | 307/456 X |
| 4,629,913 | 12/1986 | Lechner | 307/475 |
| 4,644,194 | 2/1987 | Birrittella et al. | 307/475 |
| 4,684,831 | 8/1987 | Kruest | 307/475 |
| 4,700,087 | 10/1987 | Stroberger | 307/475 |

Primary Examiner—Stanley D. Miller
Assistant Examiner—David R. Bertelson
Attorney, Agent, or Firm—Sughrue, Mion, Zinn, Macpeak & Seas

[57] ABSTRACT

An ECL-TTL level converter having a three-state output level is disclosed. A circuit provided in the converter for forming the three-state output level includes a function for protecting IC's connected to the output terminal of the converter when an negative power voltage applied to the converter is an abnormal condition.

6 Claims, 3 Drawing Sheets

ECL-TTL LEVEL CONVERTER

BACKGROUND OF THE INVENTION

The present invention relates to a level converter circuit converting an ECL (Emitter-Coupled Logic)—level signal to a TTL (Transistor-Transistor Logic)—level signal, and more particularly, to a level converter circuit having a three-state TTL output level.

Circuits have heretofore been represented by ECL and CML for forming high-speed logic circuits. In particular, ECL has been placed in the market having various functions as represented by standard SSI devices. In recent years, LSI's and semi-custom master slices constituted by ECL have been put into the market. To utilize their high-speed performance, these devices usually employ an ECL interface in the input/output portion. The ECL interface is very effective and makes it possible to constitute the highest system when the system to be constituted all has the ECL logic level, using neither TTL nor CMOS devices of dissimilar logic levels. Such a case, however, is limited to the periphery of a main frame of a large computer. In the general logic devices, a plurality of interface levels have been required accompanying the introduction of the newest microcomputer control or the semiconductor memory. That is, the high-speed operation portion of the device is constituted by ECL, but the control portion thereof is controlled by a microcomputer which is a standard device, and the memory portion is constituted by a cheaply constructed semiconductor memory device which also is a standard device. At present, these standard products are designed to meet input/output interface of the most general TTL or CMOS level. Even in the portion designed with ECL, therefore, as the integrated degree thereof increases, it becomes difficult to obtain the logic in a form in which the interface level is completely separated. Even in a single ECL device, therefore, some input/output terminals must input or output the signals on the TTL or CMOS level. In the conventional means which employs the interface, provision is made of a level converter IC as a standard product for converting the TTL level into the ECL level or for converting the ECL level into the TTL level as shown, for example, in "MECL INTEGRATED CIRCUITS DATA BOOK" No. 3, September, 1973, MOTOROLA Inc. 3–56.

A level converter can convert an ECL-level input having two-state (ECL High level state and ECL Low level state) to a TTL-level output having three-state (TTL High level state, TTL Low level state and floating state). The level converter having a three-state TTL output level can be constructed by adding circuit elements to a level converter having a two-state TTL output level (TTL High level state and TTL Low Level state) for forming the floating output state. On the other hand, the output terminal of the level converter of three-state TTL output is often connected to a bus line and may, hence, be connected to TTL output terminals of other IC's. In this case, the level converter must be so designed that when the applying negative power source is delayed behind the positive power source or when the negative power source is interrupted, the output terminal thereof exhibits a high impedance, that is, a floating condition to protect the other IC's connected to the output terminal of the level converter from the damage. Therefore, a protecting circuit is necessary in the level converter. That is, in a prior art level converter having three-state TTL output, both circuits, one is for forming a floating state of the output terminal in accordance with an ECL input signal, and the other is for forming a floating condition of the output terminal against the abnormal power supply conditions, are necessary. Therefore, the level converter having three-state TTL output in the prior art necessitates many circuit elements thereby causing the chip size to increase, obstructing a high integration of the device and impairing a high-speed operation by unfavorable junction capacitances of the circuit elements.

SUMMARY OF THE INVENTION

Accordingly, it is an object of the present invention to provide a level converter having three-state TTL output in which the floating state of the output terminal in accordance with the input signal state and the floating condition of the output terminal against the abnormal power supply condition are obtained with a small number of circuit elements thereby realizing a high integration and a high-speed operation of the device.

According to a feature of the present invention, there is provided a signal level converter which comprises a positive power supply line; a ground potential line; a negative power supply line; a first current switching logic circuit coupled to the ground potential line and to the negative power supply line, and having first, second and third ports; a second current switching logic circuit coupled to the ground potential line and to the negative power supply line, and having first, second and third ports; an input terminal connected to the first port of the first current switching logic circuit; a three-state control input terminal connected to the first port of the second current switching logic circuit; a reference potential terminal connected to the second ports of the first and second current switching logic circuits; a TTL circuit coupled to the positive power supply line and to the ground potential line, and including a phase-divide stage transistor, an output transistor and an off-buffer transistor, the phase-divide stage transistor having a base, a collector and an emitter; an output terminal connected to a connecting part between the output transistor and the off-buffer transistor; a first diode having an anode and a cathode, the anode being connected to the collector of the phase-divide stage transistor; a second diode having an anode and a cathode, the anode being connected to the base of the phase-divide stage transistor; a first transistor having a base, a collector and an emitter, the base being connected to the positive power supply line through a resistor, the emitter being connected to the ground potential line, and the collector being connected to the cathodes of the first and second diodes in common; a connecting means for connecting the third port of the first current switching logic circuit to the base of the phase-divide stage transistor to send a signal from the first current switching logic circuit to the phase-divide stage transistor; and a switching means connected to the base of the first transistor and to the third port of the second current switching logic circuit to render the first transistor in a conductive state or a nonconductive state in accordance with a signal from the second current switching logic circuit.

The switching means may be constituted by a second transistor having a base, a collector and an emitter, the base of the second transistor being connected to the ground potential line, the emitter of the second transistor being connected to the third port of the second current switching logic circuit and the collector of the second transistor being connected to the base of the first transistor. In this case, the second current switching logic circuit may include an output transistor having a collector constituting the third port such that when the output transistor of the second current switching logic circuit is conductive, the second transistor is rendered conductive and the first transistor is rendered nonconductive, and when the output transistor of the second current switching logic circuit is nonconductive, the second transistor is rendered nonconductive and the first transistor is rendered conductive.

The switching means may be constituted by a third diode having an anode and a cathode, the anode of the third diode being connected to the base of the first transistor, and the cathode of the third diode being connected to the third port of the second current switching logic circuit. In this case, the second current switching logic circuit may include an output transistor having a collector constituting the third port such that when the output transistor of the second current switching logic circuit is conductive, the third diode is rendered conductive and the first transistor is rendered nonconductive, and when the output transistor of the second current switching logic circuit is nonconductive, the third diode is rendered nonconductive and the first transistor is rendered conductive.

DESCRIPTION OF PRIOR ARTS

Figure 1:
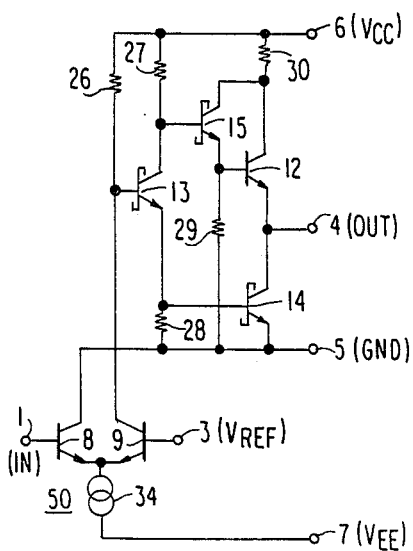
FIG. 1 is a diagram showing a conventional level converter circuit having two-state TTL output.

Referring to FIG. 1, a current switching logic circuit 50 includes a constant-current source 34 connected to a negative power supply line ($V_{EE}$ line) 7 of $-5.2$ volts at its one end, and npn type bipolar transistors 8 and 9. The emitters of the transistors 8, 9 are connected to the other end of the constant-current source 34 in common, and the base of the transistor 9 is connected to a reference potential terminal 3 from which a reference voltage $V_{ref}$ for ECL signal, about $-1.3$ volts is applied. The base of the transistor 8 is connected an input terminal (IN) 1 from which an ECL input signal is applied, and the collector of the transistor 8 is connected to a ground potential line (GND line) 5 of 0 (zero) volt. A TTL output circuit coupled to the ground potential line 5 and a positive power supply line ($V_{cc}$ line) 6 of $+5.0$ volts, includes a Schottky barrier diode type npn bipolar transistor 14 serving as an output transistor connected at its emitter to the ground potential line 5 and at its collector to an output terminal (OUT) 4 to which a TTL output signal is sent from the TTL circuit of the converter and from which the signal is outputted, an npn bipolar transistor 12 serving as an off-buffer transistor connected at its emitter to the output terminal 4 and the collector of the transistor 14 and at its collector to the positive power supply line 6 through a resistor 30, a Schottky barrier diode type npn bipolar transistor 15 serving as an off-buffer transistor with the transistor 12, connected at its emitter to the base of the transistor 12 and to the ground potential line 5 through a resistor 29 and at its collector to the positive power supply line through the resistor 30 and to the collector of the transistor 12, and a Schottky barrier diode type npn bipolar transistor 13 serving as a phase-divide stage transistor connected at its emitter to the base of the transistor 14 and to the ground potential line 5 through a resistor 28, and at its collector to the base of the transistor 15 and to the positive power supply line 6 through a resistor 27. The base of the transistor 13 is connected to the positive power supply line 6 through a resistor 26 and to the collector of the transistor 9 in the current switching logic circuit 50. When an ECL high level signal of $-0.9$ volts is inputted in the input terminal 1, a TTL low level signal of $+0.3$ volts is outputted from the output terminal 4, and when an ECL low level signal of $-1.7$ volts is inputted, a TTL high level signal $+3.5$ volts is outputted.

Incidentally, in the present Specification, the word of "Schottky barrier diode type npn bipolar transistor" means a bipolar transistor in which a Schottky barrier diode is provided between the base of p-type diffused region and the collector of n-type diffused region such that the anode of the diode is connected to the base and the cathode of the diode is connected to the collector, and the emitter of n-type diffused region is formed in the base.

Figure 2:
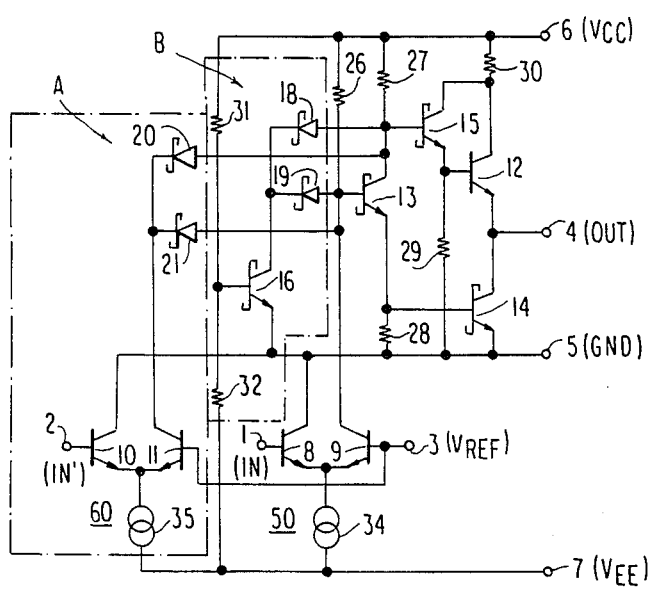
FIG. 2 is a diagram showing conventional level converter circuit having three-state TTL output.

Referring to FIG. 2, a level converter having a three-state TTL output level in a prior art will be explained. In FIG. 2, the same component as those in FIG. 1 are indicated by the same reference numerals.

To form a floating state, that is, a high impedance state at the TTL level output terminal 4 in accordance with an ECL level input signal, a circuit A encircled by a phantom line is added. The circuit A comprises a current switching logic circuit 60 and Schottky barrier diodes 20 and 21. The current switching logic circuit 60 includes a constant-current source 35 connected to the negative power source line 7 at its one end, and npn bipolar transistors 10, 11. The emitters of the transistors 10, 11 are connected to the other end of the constant-current source 35 in common, and the base of the transistor 11 is connected to the reference potential terminal 3 with the base of the transistor 9. The base of the transistor 10 is connected to a three-state control input terminal (IN') 2, and the collector of the transistor 10 is connected to the ground potential line 5. The cathodes of the diodes 20, 21 are connected to the collector of the transistor 11 in common. The anode of the diode 21 is connected to the base of the transistor 13 and the collector of the transistor 9, and the anode of the diode 20 is connected to the collector of the transistor 13 and the base of the transistor 15.

When an ECL low level signal of $-1.7$ volts is applied to the three-state control input terminal 2, the transistors 14 and 12 are turned off, that is, be rendered nonconductive and the output terminal 4 exhibits a high impedance, that is, a floating state irrespective of an ECL input signal level (high state or low state) applied to the input terminal 1. On the other hand, when an ECL high level signal of $-0.9$ volts is applied to the three-state control input terminal 2, the output terminal 4 exhibits a TTL high level or a TTL low level in accordance with an ECL input signal applied to the input terminal 1 as explained in FIG. 1. Therefore, the converter of FIG. 2 has a three-state TTL output level (high level of $+3.5$ volts, low level of $+0.3$ volts and floating level).

Here, the circuit of FIG. 2 produces three-state TTL output and its output terminal is often connected to a bus line (not shown) and may, hence, be connected to TTL output terminals of other IC's (not shown). That is, the inverter circuit must be so designed that the output terminal 4 exhibits a high impedance, that is, a floating condition such that the other IC's will not be damaged when the order for applying the power source of the negative power source 7 is delayed behind the positive power source 6 or when the negative power source 7 is interrupted.

Therefore, in FIG. 2, a protecting circuit B encircled by a phantom line is further added. The protecting circuit B comprises a Shottky barrier diode type npn bipolar transistor 16, Schottky barrier diodes 18 and 19 and resistors 31 and 32. The base of the transistor 16 is connected to the positive power supply line 6 through the resistor 31 and to the negative power supply line 7 through the resistor 32, and the emitter of the transistor 16 is connected to the ground potential line 5. The cathodes of the diodes 18, 19 are connected to the collector of the transistor 16 in common. The anode of the diode 18 is connected to the base of the transistor 15, and the anode of the diode 19 is connected to the base of the transistor 13. At the unfavorable power source condition mentioned above, the transistor 16 is turned on (conductive), and both of the transistors 14 and 12 are turned off (nonconductive). Therefore, the output terminal 4 exhibits a high-impedance condition, that is, a floating condition to protect the other IC's (not shown) connected to the output terminal 4 from the damage. The floating condition by the abnormal power supply condition is the same as the floating state by an ECL input signal, because both are formed by rendering the transistors 12 and 14 nonconductive (turn-off state). On the other hand, at the normal power source condition in which the negative voltage of −5.2 volts is applied through the line 7, the transistor 16 maintains off-state by the resistance values of the resistors 31 and 32, and the normal converter operation mentioned above is conducted.

The converter in FIG. 2 necessitates both of the circuits A and B, and hence causes the chip size to increase. Furthermore, high-speed operation characteristics of the circuit are impaired by the junction capacities of diodes 19, 21 that are connected to the base of the phase-divide stage transistor 13, by the increased capacity associated with the wiring, by the junction capacities of diodes 18, 20 connected to the collector of the phase-divide stage transistor 13, and by the increased capacity associated with the wiring. Moreover, to obtain a three-state output of floating state on the output terminal 4 while an ECL low level signal (−1.7 volts) is being applied to the three-state control input terminal 2, the electric currents flowing into the resistors 26 and 27 must all be absorbed by the constant-current source 35. In particular, the resistor 27 has a relatively small resistance. Therefore, the consumption of electric power increases as the current that flows through the resistor 27 further flows from the positive power source 6 to the negative power source 7.

In the above-mentioned conventional circuit for converting the level from the current switching logic circuit having three-state TTL output into the TTL, the circuit B is constituted independently of the three-state control circuit A to protect the other IC in case the order for applying the power source of the negative power source is delayed behind the positive power source or in case the negative power source is interrupted.

According to the present invention, on the other hand, the three-state control circuit equivalently includes a circuit that protects the IC in case the power supply becomes defective, making a difference from the prior art.

DETAILED DESCRIPTION OF EMBODIMENTS

Figure 3:
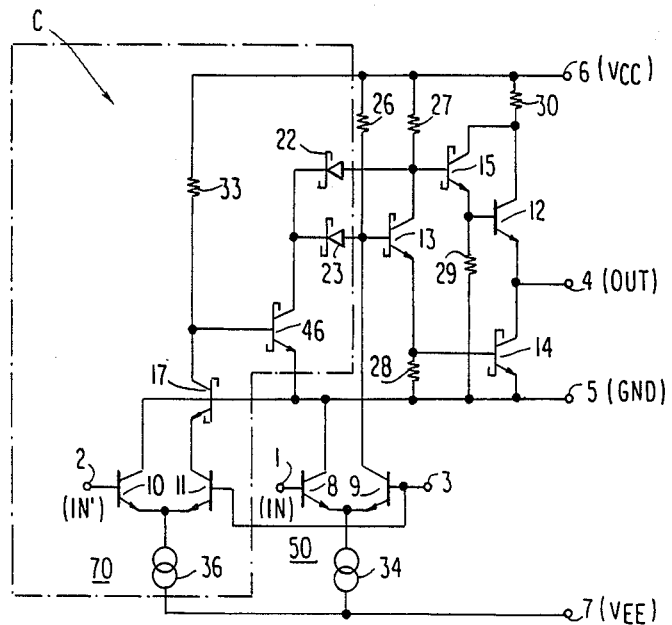
FIG. 3 is a diagram showing an embodiment of the present invention.

Referring to FIG. 3, an embodiment of the present invention will be explained. In FIG. 3, the same components as those in FIGS. 1 and 2 are indicated by the same reference numerals. The signal converter of FIG. 3 is composed by adding a circuit C encircled by a phantom line to the signal converter of FIG. 1. The circuit C of the present invention has the three-state TTL output function and the protecting function. That is, the circuit C in FIG. 3 can be employed as both of the circuits A and B in FIG. 2. The circuit C comprises a current switching logic circuit 70, Schottky barrier diode type npn bipolar transistors 17 and 46, Schottky barrier diodes 22 and 23 and a resistor 33. The current switching logic circuit 70 includes a constant-current source 36 connected to the negative power source line ($V_{EE}$) 7 of −5.2 volts at its one end, and npn bipolar transistors 10 and 11. The emitters of the transistors 10 and 11 are connected to the other end of the constant-current source 36 in common, and the base of the transistor 11 is connected to the reference potential terminal 3 to be supplied the reference voltage $V_{ref}$ for ECL signal, about −1.3 volts, with the base of the transistor 9. The base of the transistor 10 is connected to the three-state control input terminal 2, and the collector of the transistor 10 is connected to the ground potential line (GND) 5 of zero volt. The emitter of the transistor 17 is connected to the collector of the transistor 11, and the base of the transistor 17 is connected to the ground potential line 5. The collector of the transistor 17 is connected to the positive power source line ($V_{cc}$) 6 of +5.0 volts through the resistor 33 and to the base of the transistor 46. The emitter of the transistor 46 is connected to the ground potential line 5 of 0 (zero) volt, and the cathodes of the diodes 22, 23 are connected to the collector of the transistor 46 in common. The anode of the diode 22 is connected to the base of the off-buffer transistor 15 and to the collector of the phase-divide stage transistor 13, and the anode 23 is connected to the base of the phase-divide stage transistor 13 and to the collector of the transistor 9 in the current switching logic circuit 50.

Next, the operation will be explained. When an ECL high level signal of −0.9 volts is inputted in the three-state input terminal (IN′) 2, the transistor 10 is turned on (conductive) and the transistors 11 and 17 are turned off (nonconductive), so that the transistor 46 is turned on (conductive) by the resistor 33. The currents flowing through the resistors 26 and 27 constitute a collector current of the transistor 46 via diodes 23 and 22. Consequently, the transistors 12 and 14 are turned-off (nonconductive), and the output terminal 4 exhibits the high-impedance condition, that is, a floating state irrespective of an ECL input signal level (high state or low state) applied to the input terminal 1. On the other hand, when an ECL low level signal of −1.7 volts is applied to the three-state control input terminal 2, the transistor 10 is turned off and the transistor 11 and 17 are turned on, whereby the transistor 46 is turned off and the output terminal 4 exhibits a TTL low level of +0.3 volts in accordance with an ECL high level of −0.9 volts applied to the input terminal 1 and a TTL high level of +3.5 volts in accordance with an ECL low level of −1.7 volts applied to the input terminal 1. Therefore, the converter of FIG. 3 has a three-state TTL output level (high level of +3.5 volts, low level of 0.3 volts and floating level).

On the other hand, in case the order for applying the power source of the negative power sources 7 is lagged behind the position power source 6 or in case the negative power source 7 is interrupted, the transistors 11 and 17 are turned off (nonconductive) and the transistor 46 is turned on (conductive) by the resistor 33. The currents flowing through the resistors 26 and 27 constitute a collector current of the transistor 46 via diodes 23 and 22. Consequently, the transistors 12 and 14 are turn-off (nonconductive) and the output terminal 4 maintain a floating condition to protect other IC's (not shown) connected to the output terminal 4. At the time when the normal negative power voltage of −5.2 volts is applied through the line 7, the three-state converter operation mentioned above is conducted.

That is, the three-state control circuit in this circuit includes a circuit which renders the output to exhibit the floating condition in case the power supply becomes defective. Therefore, this circuit makes it possible to decrease the number of elements compared with that of the conventional circuit of FIG. 2, as well as to decrease the number of diodes connected to the base and collector of the phase-divide stage transistor 13, making it possible to decrease the junction capacities and wiring capacities associated with the base and the collector. Therefore, the chip size can be reduced and the operation speed of the circuit can be increased.

Moreover, in the conventional circuit of FIG. 2, electric currents flowing through the resistors 26 and 27 reach the negative power source 7 via diodes 20, 21, transistor 11 and constant-current power source 35 under the condition where the ECL low level signal is applied to the three-state control input terminal 2 and the output 4 exhibits the floating state. According to the circuit of the present invention, on the other hand, the abovementioned currents reach the ground potential line 5 via diodes 22, 23 and transistor 46, contributing to reducing the consumption of electric power.

Figure 4:
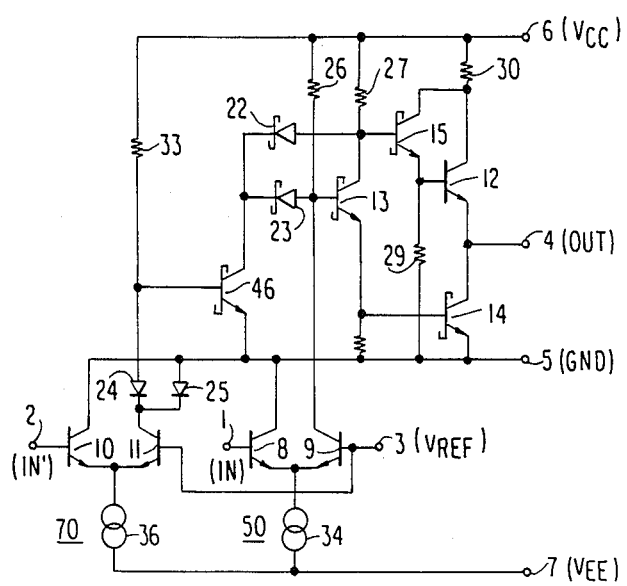
FIG. 4 is a diagram showing another embodiment of the present invention.

FIG. 4 is a diagram of a circuit connection according to another embodiment of the present invention. In FIG. 4, the same components as those in FIG. 3 are indicated by the same reference numerals. In this embodiment, a diode 24 is inserted instead of the transistor 17 shown in FIG. 3. Further, a diode 25 is provided to clamp the base potential of the transistor 46 under the condition where the transistor 11 is turned on. The fundamental operation and effects of the circuit of FIG. 4 are the same as those of the circuit of FIG. 3.

As described above, in the present invention concerned with the circuit for converting the level from the current switching logic circuit having three-state TTL output into the TTL, the three-state control circuit equivalently includes a circuit which establishes the high-impedance condition to protect the IC when the power source becomes defective. Therefore, the chip size is reduced owing to the decrease in the number of elements, the circuit operates at an increased speed owing to the reduction in the capacity, and the consumption of electric power by the circuit is reduced due to a change in the current path under the high-impedance condition.

What is claimed is:

1. A signal level converter comprising:
   a positive power supply line;
   a ground potential line;
   a negative power supply line;
   a first current switching logic circuit coupled to said ground potential line and to said negative power supply line, and having first, second and third ports;
   a second current switching logic circuit coupled to said ground potential line and to said negative power supply line, and having first, second and third ports;
   an input terminal connected to said first port of said first current switching logic circuit;
   a three-state control input terminal connected to said first port of said second current switching logic circuit;
   a reference potential terminal connected to said second ports of said first and second current switching logic circuits;
   a TTL circuit coupled to said positive power supply line and to said ground potential line, and including a phase-divide stage transistor, an output transistor and a off-buffer transistor, said phase-divide stage transistor having a base, a collector and an emitter;
   an output terminal connected to a connecting port between said output transistor and said off-buffer transistor;
   a first diode having an anode and a cathode, said anode being connected to said collector of said phase-divide stage transistor;
   a second diode having an anode and a cathode, said anode being connected to said base of said phase-divide stage transistor;
   a first transistor having a base, a collector and an emitter, said base being connected to said positive power supply line through a resistor, said emitter being connected to said ground potential line, and said collector being connected to said cathodes of said first and second diodes in common;
   a connecting means for connecting said third port of said first current switching logic circuit to said base of said phase-divide stage transistor to send a signal from said first current switching logic circuit to said phase-divide stage transistor; and
   a switching means connected to said base of said first transistor and to said third port of said second current switching logic circuit to render said first transistor in a conductive state or a nonconductive state in accordance with a signal from said second current switching logic circuit.

2. A signal level converter of claim 1, in which said switching means is constituted by a second transistor having a base, a collector and an emitter, said base of said second transistor being connected to said ground potential line, said emitter of said second transistor being connected to said third port of said second current switching logic circuit and said collector of said second transistor being connected to said base of said first transistor.

3. A signal level converter of claim 2, in which said second current switching logic circuit includes an output transistor having a collector constituting said third port such that when said output transistor of said second current switching logic circuit is conductive, said second transistor is rendered conductive and said first transistor is rendered nonconductive, and when said output transistor of said second current switching logic circuit is nonconductive said second transistor is rendered nonconductive, and said first transistor is rendered conductive.

4. A signal level converter of claim 1, in which said switching means is constituted by a third diode having an anode and a cathode, said anode of said third diode being connected to said base of said first transistor, and said cathode of said third diode being connected to said third port of said second current switching logic circuit.

5. A signal level converter of claim 4, in which said second current switching logic circuit includes an output transistor having a collector constituting said third port such that when said output transistor of said second current switching logic circuit is conductive, said third diode is rendered conductive and said first transistor is rendered nonconductive, and when said output transistor of said second current switching logic circuit is nonconductive, said third diode is rendered nonconductive and said first transistor is rendered conductive.

6. A signal level converter of claim 4 further comprising a fourth diode having an anode and a cathode, said anode of said fourth diode being connected to said ground potential line and said cathode of said fourth diode being connected to said third port of said second current switching logic circuit with said cathode of said third diode.

* * * * *